US008853655B2

(12) United States Patent
Bezel et al.

(10) Patent No.: US 8,853,655 B2
(45) Date of Patent: Oct. 7, 2014

(54) GAS REFRACTION COMPENSATION FOR LASER-SUSTAINED PLASMA BULBS

(71) Applicants: Ilya Bezel, Sunnyvale, CA (US); Anatoly Shchemelinin, Pleasanton, CA (US); Alex Salnik, San Jose, CA (US); Anant Chimmalgi, San Jose, CA (US)

(72) Inventors: Ilya Bezel, Sunnyvale, CA (US); Anatoly Shchemelinin, Pleasanton, CA (US); Alex Salnik, San Jose, CA (US); Anant Chimmalgi, San Jose, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/183,134

(22) Filed: Feb. 18, 2014

(65) Prior Publication Data

US 2014/0239202 A1 Aug. 28, 2014

Related U.S. Application Data

(60) Provisional application No. 61/767,917, filed on Feb. 22, 2013.

(51) Int. Cl.

| | |
|---|---|
| ***F21V 5/00*** | (2006.01) |
| ***F21V 7/00*** | (2006.01) |
| ***F21V 13/04*** | (2006.01) |
| ***H01J 37/32*** | (2006.01) |
| ***H01J 61/02*** | (2006.01) |

(52) U.S. Cl.
CPC .................................... *H01J 61/02* (2013.01)
USPC .................... 250/493.1; 250/503.1; 313/110; 313/113; 313/567; 313/231.31; 315/111.71; 362/562; 362/259; 362/326; 362/327; 362/329

(58) Field of Classification Search
USPC ........... 250/493.1, 503.1, 504 R, 526, 432 R; 313/110–114, 567, 568, 231.31, 313/231.41, 231.61, 231.71, 358; 315/111.21, 111.71, 111.91; 362/276, 362/609, 623, 632, 553, 560, 562, 84, 259, 362/326–329, 362, 375
See application file for complete search history.

(56) References Cited

U.S. PATENT DOCUMENTS

| | | | | |
|---|---|---|---|---|
| 3,943,324 | A * | 3/1976 | Haggerty | 219/121.63 |
| 4,197,157 | A * | 4/1980 | Haggerty | 117/18 |
| 8,525,138 | B2 * | 9/2013 | Smith et al. | 250/503.1 |
| 8,658,967 | B2 * | 2/2014 | Bezel et al. | 250/251 |
| 2007/0228288 | A1 * | 10/2007 | Smith | 250/426 |
| 2007/0228300 | A1 * | 10/2007 | Smith | 250/504 R |
| 2013/0003384 | A1 * | 1/2013 | Bezel et al. | 362/276 |
| 2013/0106275 | A1 * | 5/2013 | Chimmalgi et al. | 313/39 |
| 2013/0181595 | A1 * | 7/2013 | Bezel et al. | 313/112 |
| 2013/0342105 | A1 * | 12/2013 | Shchemelinin et al. | 315/111.21 |
| 2014/0042336 | A1 * | 2/2014 | Bezel et al. | 250/424 |

* cited by examiner

*Primary Examiner* — Bernard E Souw
(74) *Attorney, Agent, or Firm* — Meyertons, Hood, Kivlin, Kowert & Goetzel, P.C.; Eric B. Meyertons

(57) ABSTRACT

A laser-sustained plasma illuminator system includes at least one laser light source to provide light. At least one reflector focuses the light from the laser light source at a focal point of the reflector. An enclosure substantially filled with a gas is positioned at or near the focal point of the reflector. The light from the laser light source at least partially sustains a plasma contained in the enclosure. The enclosure has at least one wall with a thickness that is varied to compensate for optical aberrations in the system.

20 Claims, 3 Drawing Sheets

GAS REFRACTION COMPENSATION FOR LASER-SUSTAINED PLASMA BULBS

PRIORITY CLAIM

This patent claims priority to U.S. Provisional Patent Application No. 61/767,917 filed Feb. 22, 2013, which is incorporated by reference in its entirety.

BACKGROUND

1. Field of the Invention

The present invention relates to laser-sustained plasma illuminator systems. More particularly, the invention relates to systems and methods for compensating for optical aberrations to optimize plasma performance and UV light collection.

2. Description of Related Art

Plasmas sustained by lasers have shapes defined by the laser light intensity distribution near the laser focus. The laser light intensity distribution may be a function of optical aberrations (e.g., how well the light is focused in the plasma cell). Many optical aberrations present in typical laser-sustained plasma illuminator systems are aberrations introduced by an enclosure (e.g., a bulb) used to contain the gas and the plasma. Such bulb-introduced aberrations may be significant optical aberrations, especially for plasmas sustained by lasers operating in the near IR range (wavelengths of about 1000 nm). These significant optical aberrations may result in large size plasmas, the inability to control the bulb envelope, and/or irreproducible plasma shapes.

FIG. 1 depicts different plasma shapes resulting from various optical abberrations of a pump beam in different bulbs. Shape 100 results from a pump beam with significant aberrations. These significant aberrations produce a football shaped plasma for shape 100. Shape 102 results from a pump beam with less aberrations. These fewer aberrations may produce a spherical shaped plasma for shape 102. Shape 104 results from a pump beam with the fewest aberrations. Shape 104 may be the smallest and brightest plasma shape (e.g., a cylindrical plasma shape) of the three shapes depicted in FIG. 1 because of the fewest aberrations.

Aberrations may become particularly large when a high NA (numerical aperture) is used for pumping the plasma. Large pump laser NAs are used as light sources in many current laser-sustained plasma illuminator systems. U.S. Pat. No. 7,705,331 to Kirk et al., which is incorporated by reference as if fully set forth herein, describes an example of a high NA system. FIG. 2 depicts an example of a laser-sustained light source with a high NA. Light source 200 may include laser 202, turn mirror 204, cold mirror 206, homogenizer 208, filters 210, ellipse 212, and enclosure 214. Enclosure 214 may be, for example, a bulb. Ignition cable 216 may be coupled to enclosure 214. Plasma 217 may be generated inside enclosure 214 at or near a focal point of ellipse 212. As shown in FIG. 2, light from laser 202 (e.g., light 218) may be reflected off ellipse 212 and focused in the middle of enclosure 214 at plasma 217. Broad-band UV light (e.g., light 220) from homogenizer 208 may be reflected by cold mirror 206, reflected off ellipse 212, and focused in the middle of enclosure 214 at plasma 217. Light passing through enclosure 214 may be used to excite and/or sustain plasma 217 inside the enclosure. Plasma 217 inside enclosure 214 may provide light for illumination of a specimen for a process performed on the specimen (e.g., an inspection process performed on the specimen). As shown in FIG. 2, light passing through enclosure 214 may have a high NA.

In addition to the aberrations introduced by the enclosure itself, the refractive index of the gas inside the enclosure is another source of aberrations in the system. Gas related aberrations may be especially significant in high-pressure enclosures. FIG. 3 depicts images taken of a bulb at different pressures of Xe (xenon) in the bulb. As shown in FIG. 3, aberrations seen from the bulb increase with increasing pressure.

U.S. Pub. Pat. Appl. Nos. 2007/0228288 and 2007/0228300 to Smith, each of which is incorporated by reference as if fully set forth herein, disclose one method of compensating for aberrations introduced by the refractive index of the walls of the enclosure by modifying the shape of the reflector (e.g., a reflective ellipse). Modifying the shape of the reflector, however, can only account for aberrations from reproducible enclosure shapes. Modifying reflector shapes for each individual enclosure shape and/or different fill pressures is difficult to impractical to implement for most laser-sustained plasma illuminator systems.

SUMMARY

In certain embodiments, a laser-sustained plasma illuminator system includes at least one laser light source to provide light. At least one reflector focuses the light from the laser light source at a focal point of the reflector. An enclosure substantially filled with a gas is positioned at or near the focal point of the reflector. The light from the laser light source at least partially sustains a plasma contained in the enclosure. The enclosure has at least one wall with a thickness that is varied. The enclosure wall thickness may be varied to compensate for optical aberrations in the system.

In certain embodiments, a method for compensating for optical aberrations in a laser-sustained plasma illuminator system includes providing light from at least one laser light source and focusing the light from the at least one laser light source to an enclosure substantially filled with a gas. A plasma may be generated in the enclosure. The enclosure may have at least one wall with a thickness that is varied to compensate for optical aberrations in the system.

In certain embodiments, a method for compensating for optical aberrations in a laser-sustained plasma illuminator system includes providing an enclosure for containing a plasma to the laser-sustained plasma illuminator system. The enclosure may have at least one wall with a thickness that is varied to compensate for optical aberrations in the system.

BRIEF DESCRIPTION OF THE DRAWINGS

Features and advantages of the methods and apparatus of the present invention will be more fully appreciated by reference to the following detailed description of presently preferred but nonetheless illustrative embodiments in accordance with the present invention when taken in conjunction with the accompanying drawings in which.

Figure 1:
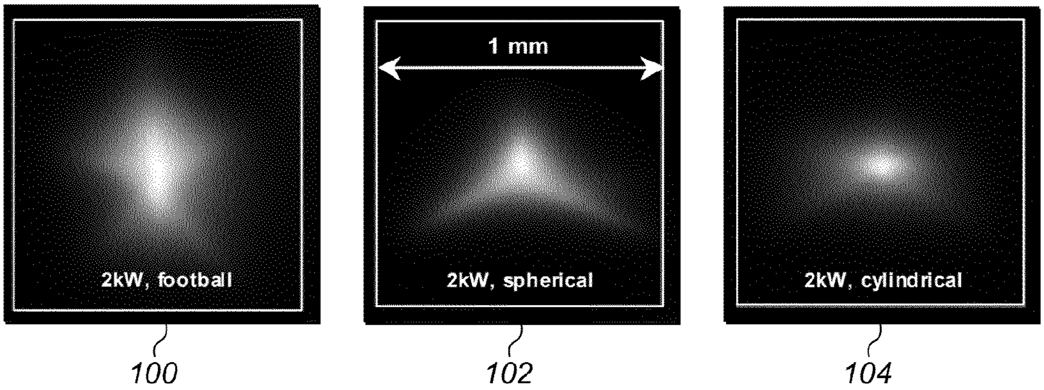
FIG. 1 depicts different plasma shapes resulting from various optical abberrations of a pump beam in different bulbs.
Figure 2:
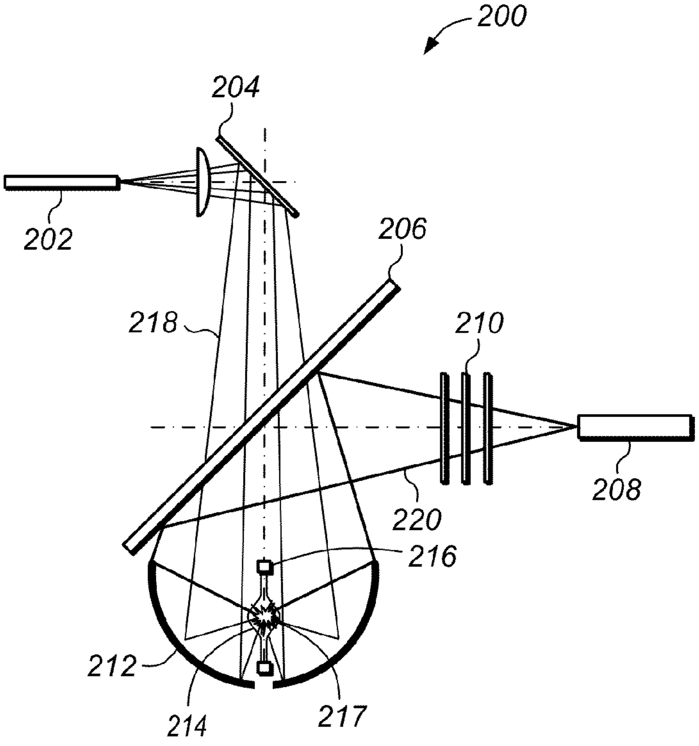
FIG. 2 depicts an example of a laser-sustained light source with a high numerical aperture (NA).
Figure 3:
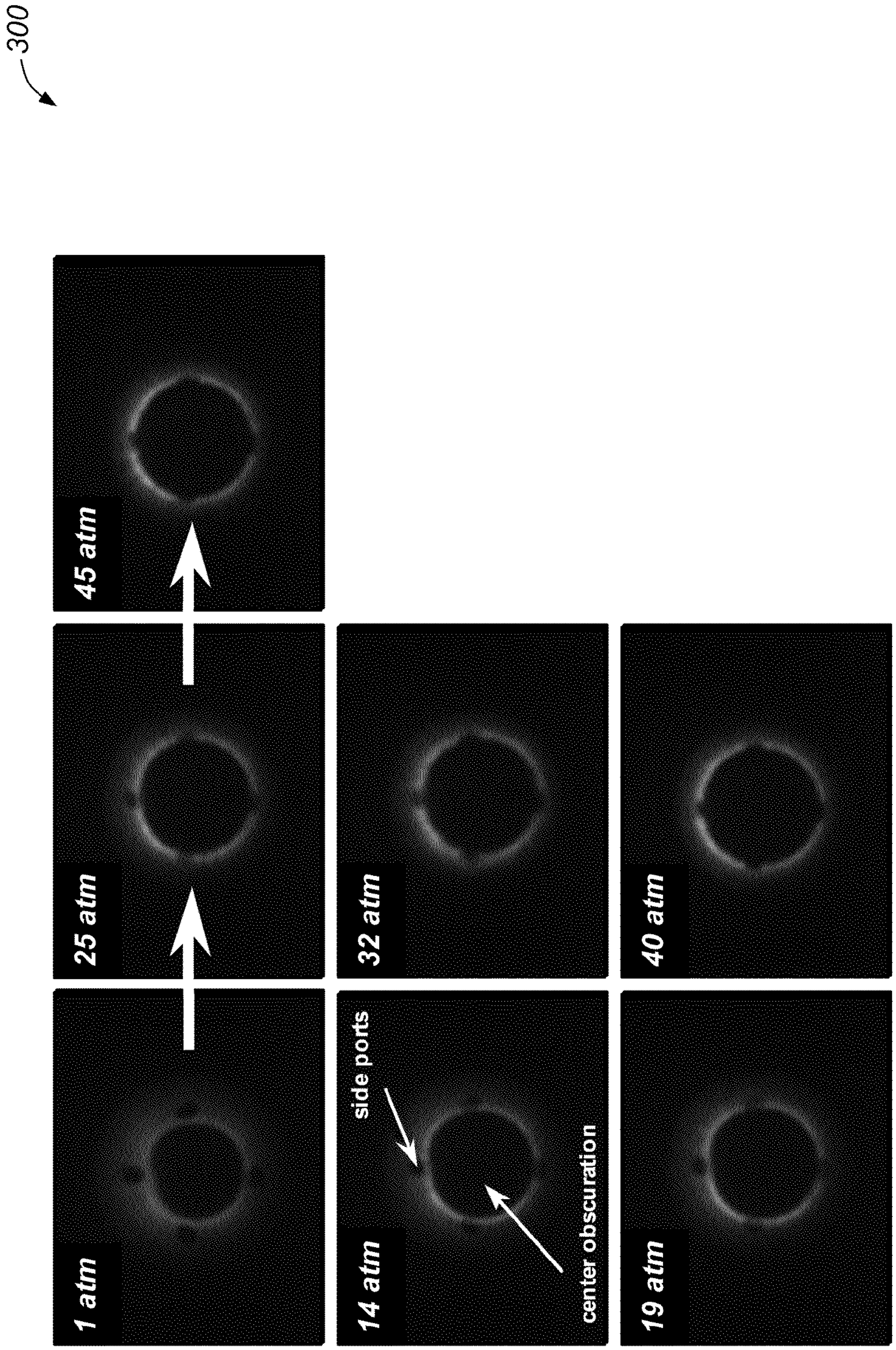
FIG. 3 depicts images taken of a bulb at different pressures of Xe (xenon) in the bulb.

While the invention is susceptible to various modifications and alternative forms, specific embodiments thereof are shown by way of example in the drawings and will herein be described in detail. The drawings may not be to scale. It should be understood that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF EMBODIMENTS

In certain embodiments, the wall thickness of an enclosure (e.g., a bulb) is adjusted to compensate for shape aberrations in the enclosure and/or aberrations induced by the gas refractive index (e.g., fill pressure aberrations). FIG. 4A depicts an embodiment of an ideal enclosure with no compensation needed. Enclosure 400A has no aberrations in shape and no gas induced aberrations. Thus, all light from pump laser 402 is focused at plasma 404. FIG. 4B depicts an embodiment of an enclosure with shape induced aberrations and no compensation. Enclosure 400B has shape aberrations that, without compensation, cause some light from pump laser 402 to not be focused at plasma 404 (e.g., light 406).

Figure 4C:
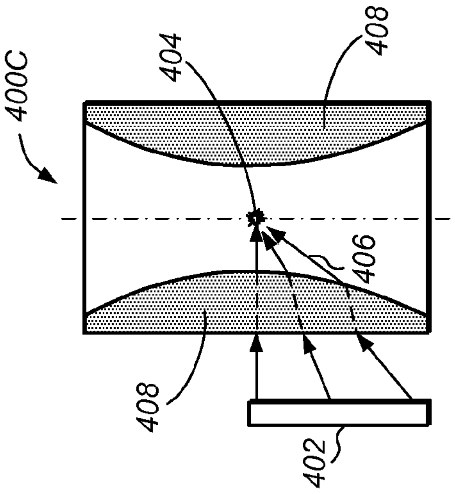
FIG. 4C depicts an embodiment of an enclosure with walls having varying thickness to compensate for enclosure shape aberrations.
Figure 4B:
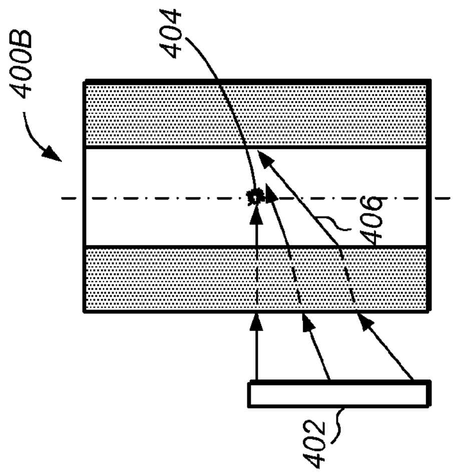
FIG. 4B depicts an embodiment of an enclosure with shape induced aberrations and no compensation.
Figure 4A:
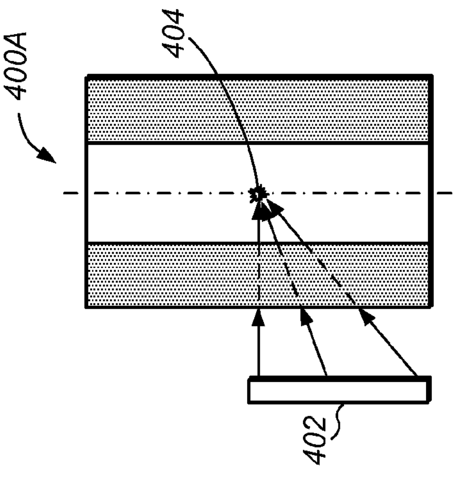
FIG. 4A depicts an embodiment of an ideal enclosure with no compensation needed.

FIG. 4C depicts an embodiment of an enclosure with walls having varying thickness to compensate for enclosure shape aberrations. Enclosure 400C has walls 408 with varying thickness. The varying thickness of walls 408 compensates for any enclosure shape aberrations and/or fill pressure aberrations to focus light from pump laser 402 at plasma 404. For example, as shown in FIG. 4C, light 406 is now focused at plasma 404.

In certain embodiments, enclosure 400C is a bulb. The bulb may be, for example, a lamp made of glass (fused silica) using a bulb-specific manufacturing process. In some embodiments, enclosure 400C is any other type of enclosure, vessel, or container that encloses/contains gas and has walls made of a transparent material. Enclosure 400C may be an enclosure made of glass, quartz, sapphire, $CaF_2$, $MgF_2$, or similar materials with proper sealing to enclose/contain a gas. For example, enclosure 400C may be a tube or cell made of glass with sealing to enclose a gas.

In certain embodiments, the thickness variation in walls 408 (e.g., the shape of the walls as defined by changes in the wall thickness along a section of the wall) is defined based on the shape of the envelope of enclosure 400C and/or the gas fill pressure of the enclosure. Varying the thickness of the walls of enclosures (e.g., walls 408 of enclosure 400C) to compensate for aberrations in the enclosures (e.g., enclosure wall thickness compensation) allows a single uncompensated reflector to be used for all types of enclosures with varying shapes and/or fill pressures. Thus, a laser-sustained plasma illuminator system using enclosures with enclosure wall thickness compensation may have improved performance and/or improved cost efficiency compared to typical current laser-sustained plasma illuminator systems (e.g., systems using modified reflector shapes for aberration compensation).

In some embodiments, enclosure wall thickness compensation is used to compensate for aberrations in the collected light path (e.g., the path of light before the light enters the enclosure or the path of light from the light source (laser) through focusing optics (such as mirrors and/or reflectors). In some embodiments, enclosure wall thickness compensation is used to introduce a controlled amount of aberration into a laser-sustained plasma illuminator system. For example, wall thickness may be varied to provide a controlled amount of aberration to optimize plasma performance in the laser-sustained plasma illuminator system.

In some embodiments, enclosure wall thickness compensation is used in combination with other compensation methods. Combining enclosure wall thickness compensation with other compensation methods may provide higher levels of control of aberrations in a laser-sustained plasma illuminator system. For example, in one embodiment, enclosure wall thickness may be varied in combination with the shape of the enclosure. In some embodiments, enclosure wall thickness compensation is combined with compensation using modified reflector shapes to provide greater control of the shape of the plasma.

It is to be understood the invention is not limited to particular systems described which may, of course, vary. It is also to be understood that the terminology used herein is for the purpose of describing particular embodiments only, and is not intended to be limiting. As used in this specification, the singular forms "a", "an" and "the" include plural referents unless the content clearly indicates otherwise. Thus, for example, reference to "a wall" includes a combination of two or more walls and reference to "a gas" includes mixtures of gases.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A laser-sustained plasma illuminator system, comprising:

at least one laser light source configured to provide light;

at least one reflector configured to focus the light from the at least one laser light source at a focal point of the reflector; and an enclosure substantially filled with a gas positioned at or near the focal point of the reflector, wherein the light from the at least one laser light source at least partially sustains a plasma contained in the enclosure, and wherein the enclosure has at least one wall with a thickness that is varied.

2. The system of claim 1, wherein the variation in the thickness of the at least one wall is based on a shape of an envelope of the enclosure and a pressure of the gas substantially filling the enclosure.

3. The system of claim 1, wherein the at least one light source comprises at least two laser light sources whose light is combined by the at least one reflector.

4. The system of claim 1, further comprising additional focusing optics configured to collect and focus the light from the at least one laser light source at the focal point of the reflector.

5. The system of claim 1, wherein the at least one wall's thickness is varied to compensate for optical aberrations in the system.

6. The system of claim 5, wherein the optical aberrations comprise aberrations in a shape of the enclosure.

7. The system of claim 5, wherein the optical aberrations are induced by a refractive index of the gas substantially filling the enclosure.

8. The system of claim 5, wherein the optical aberrations comprise aberrations in an optical path of the light from the at least one laser light source.

9. The system of claim 1, wherein the at least one wall's thickness is varied to introduce controlled aberrations into the system.

10. The system of claim 1, wherein the reflector comprises a shape that is modified to compensate for optical aberrations in the system.

11. The system of claim 1, wherein the system is configured to illuminate a specimen with light generated by the plasma contained in the enclosure.

12. A method for compensating for optical aberrations in a laser-sustained plasma illuminator system, comprising:

providing light from at least one laser light source;

focusing the light from the at least one laser light source to an enclosure substantially filled with a gas;

generating a plasma in the enclosure;

wherein the enclosure has at least one wall with a thickness that is varied.

13. The method of claim 12, wherein the variation in the thickness of the at least one wall is based on a shape of an envelope of the enclosure and a pressure of the gas substantially filling the enclosure.

14. The method of claim 12, wherein the at least one wall's thickness is varied to compensate for optical aberrations in the system.

15. The method of claim 12, wherein the at least one wall's thickness is varied to introduce controlled aberrations into the system.

16. The method of claim 12, further comprising illuminating a specimen with light generated by the plasma contained in the enclosure.

17. A method for compensating for optical aberrations in a laser-sustained plasma illuminator system, comprising: providing an enclosure for containing a plasma to the laser-sustained plasma illuminator system, wherein the enclosure has at least one wall with a thickness that is varied to compensate for optical aberrations in the system.

18. The method of claim 17, wherein the thickness of the at least one wall is varied based on a shape of an envelope of the enclosure and a pressure of the gas substantially filling the enclosure.

19. The method of claim 17, further comprising providing at least one reflector to the laser-sustained plasma illuminator system, wherein the at least one reflector has a shape modified to compensate for optical aberrations in the system.

20. The method of claim 17, further comprising illuminating a specimen with light generated by the plasma contained in the enclosure.

* * * * *